US011757037B2

United States Patent
Jambunathan et al.

(10) Patent No.: US 11,757,037 B2
(45) Date of Patent: *Sep. 12, 2023

(54) EPITAXIAL OXIDE PLUG FOR STRAINED TRANSISTORS

(71) Applicant: Intel Corporation, Santa Clara, CA (US)

(72) Inventors: Karthik Jambunathan, Kirkland, WA (US); Biswajeet Guha, Hillsboro, OR (US); Anupama Bowonder, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/569,643

(22) Filed: Jan. 6, 2022

(65) Prior Publication Data

US 2022/0131007 A1     Apr. 28, 2022

Related U.S. Application Data

(63) Continuation of application No. 16/640,465, filed as application No. PCT/US2017/053582 on Sep. 27, 2017, now Pat. No. 11,251,302.

(51) Int. Cl.
*H01L 29/78*     (2006.01)
*H01L 21/8234*   (2006.01)
(Continued)

(52) U.S. Cl.
CPC .. *H01L 29/7846* (2013.01); *H01L 21/823431* (2013.01); *H01L 21/823481* (2013.01);
(Continued)

(58) Field of Classification Search
CPC ......... H01L 29/7846; H01L 21/823431; H01L 21/823481; H01L 27/0886; H01L 27/0924;
(Continued)

(56) References Cited

U.S. PATENT DOCUMENTS 9,025,358 B2 *  5/2015  Widjaja .................. G11C 11/21
                                                       365/100
2009/0101982 A1   4/2009  Nagatomo
(Continued)

FOREIGN PATENT DOCUMENTS

KR   1020150081738   7/2015
TW      201701477    1/2017
(Continued)

OTHER PUBLICATIONS

International Search Report and Written Opinion received for PCT Application No. PCT/US2017/053582 dated Jun. 15, 2018. 11 pages.

(Continued)

*Primary Examiner* — Jonathan Han
(74) *Attorney, Agent, or Firm* — Schwabe, Williamson & Wyatt, P.C.

(57) ABSTRACT

Epitaxial oxide plugs are described for imposing strain on a channel region of a proximate channel region of a transistor. The oxide plugs form epitaxial and coherent contact with one or more source and drain regions adjacent to the strained channel region. The epitaxial oxide plugs can be used to either impart strain to an otherwise unstrained channel region (e.g., for a semiconductor body that is unstrained relative to an underlying buffer layer), or to restore, maintain, or increase strain within a channel region of a previ-
(Continued)

ously strained semiconductor body. The epitaxial crystalline oxide plugs have a perovskite crystal structure in some embodiments.

20 Claims, 10 Drawing Sheets

(51) Int. Cl.
*H01L 27/088* (2006.01)
*H01L 27/092* (2006.01)
*H01L 29/423* (2006.01)

(52) U.S. Cl.
CPC ...... *H01L 27/0886* (2013.01); *H01L 27/0924* (2013.01); *H01L 29/42392* (2013.01)

(58) Field of Classification Search
CPC ........... H01L 29/42392; H01L 29/0673; H01L 29/083; H01L 29/0847; H01L 29/401; H01L 29/41725; H01L 29/66356; H01L 29/66439; H01L 29/7391; H01L 29/775; H01L 29/7843; H01L 29/785; H01L 29/66795; B82Y 10/00
See application file for complete search history.

(56) References Cited

U.S. PATENT DOCUMENTS

| | | |
|---|---|---|
| 2010/0136761 A1 | 6/2010 | Han |
| 2013/0270638 A1* | 10/2013 | Adam ................. H01L 29/7848 |
| | | 257/E21.409 |
| 2014/0346600 A1* | 11/2014 | Cheng ............... H01L 29/66636 |
| | | 257/347 |
| 2016/0056154 A1 | 2/2016 | Watanabe |
| 2016/0104701 A1 | 4/2016 | Yoo |
| 2016/0372598 A1 | 12/2016 | Wang et al. |
| 2016/0380056 A1* | 12/2016 | Yeo ................... H01L 29/42392 |
| | | 438/283 |
| 2017/0250280 A1 | 8/2017 | Wu |
| 2018/0130802 A1* | 5/2018 | Wang ................. H01L 27/0928 |

FOREIGN PATENT DOCUMENTS

| | | |
|---|---|---|
| TW | 201731111 | 9/2017 |
| WO | WO 2019066788 | 4/2019 |

OTHER PUBLICATIONS

International Preliminary Report on Patentability for Application No. PCT/US2017/053582 dated Mar. 31, 2020, 7 pages.
Office Action from Taiwan Patent Application No. 107127417, dated Mar. 18, 2022, 13 pgs.
Notice of Allowance from Taiwan Patent Application No. 107127417, dated Jul. 26, 2022, 3 pgs., with English translation.

* cited by examiner

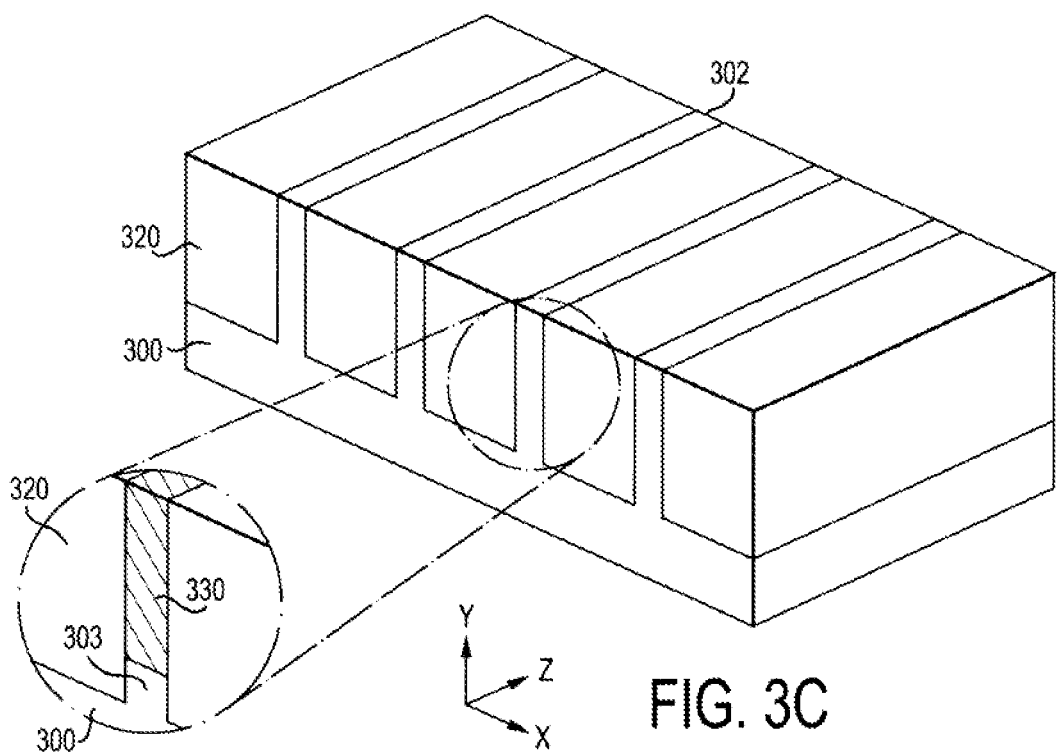
FIG. 3C'
FIG. 3C
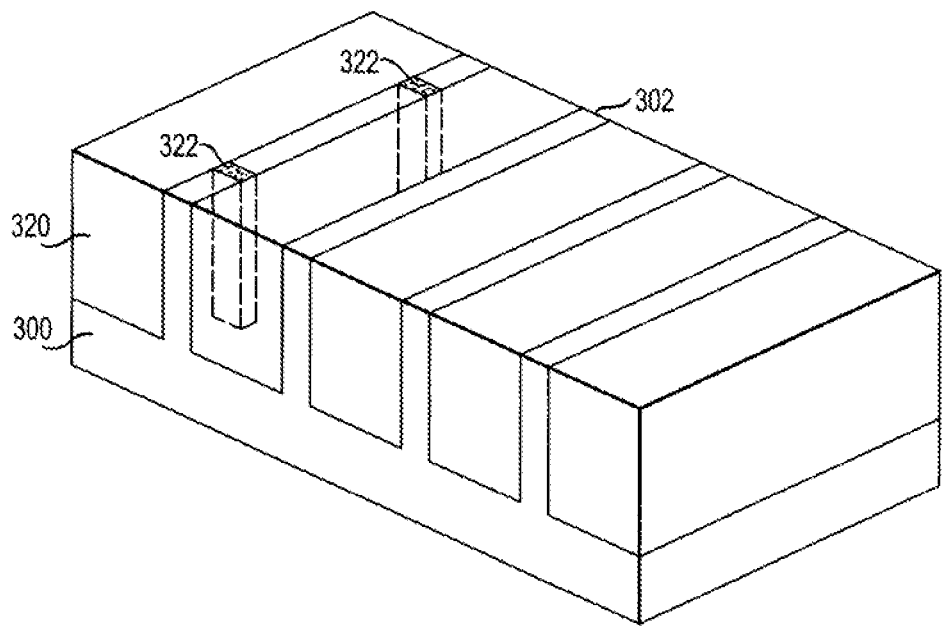
FIG. 3D

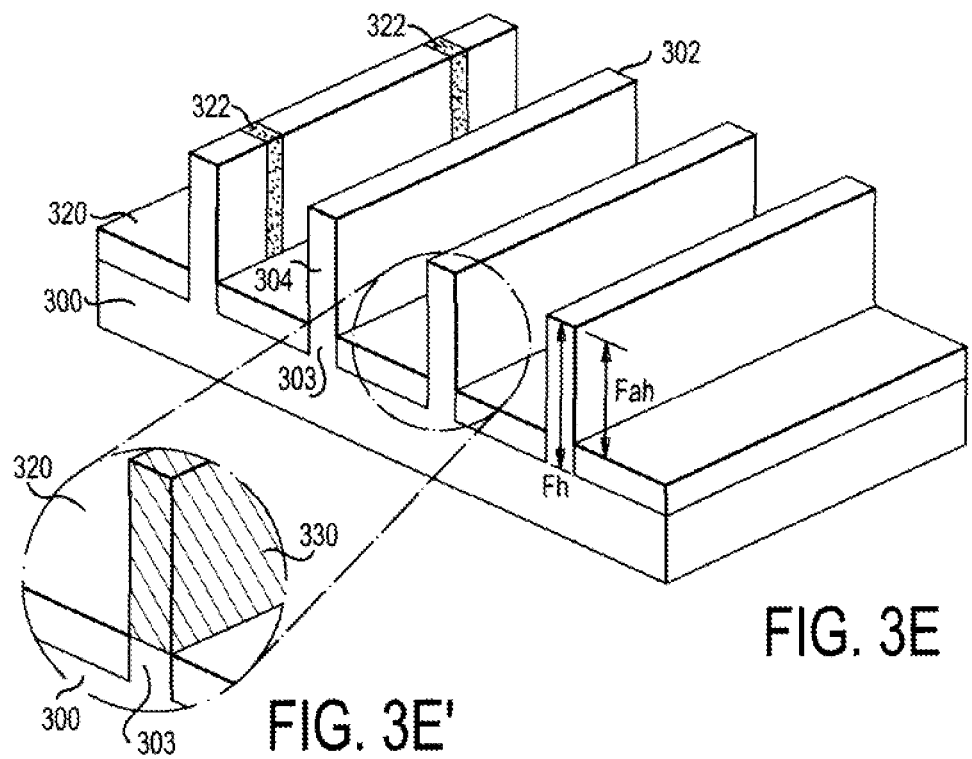
FIG. 3E
FIG. 3E'
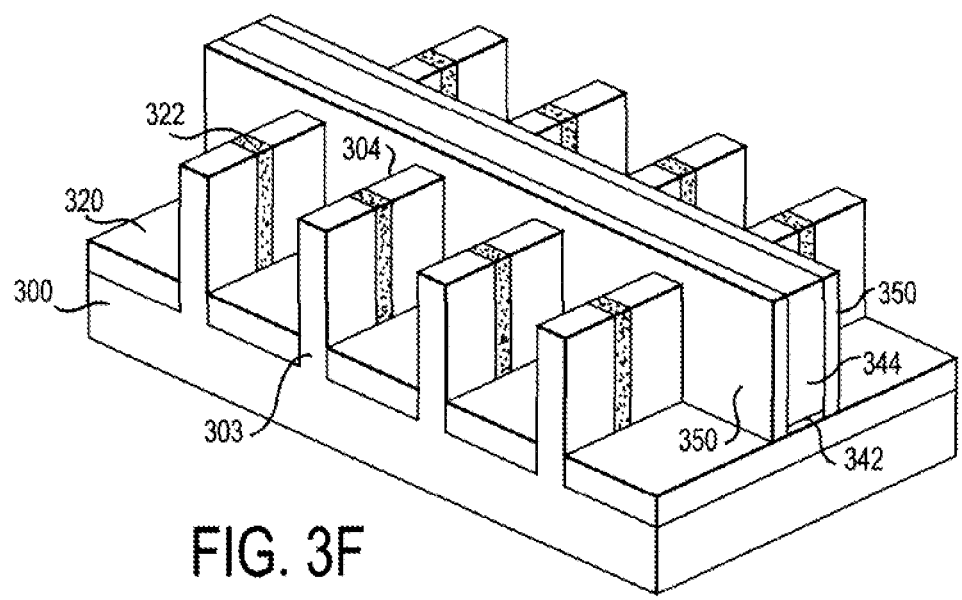
FIG. 3F

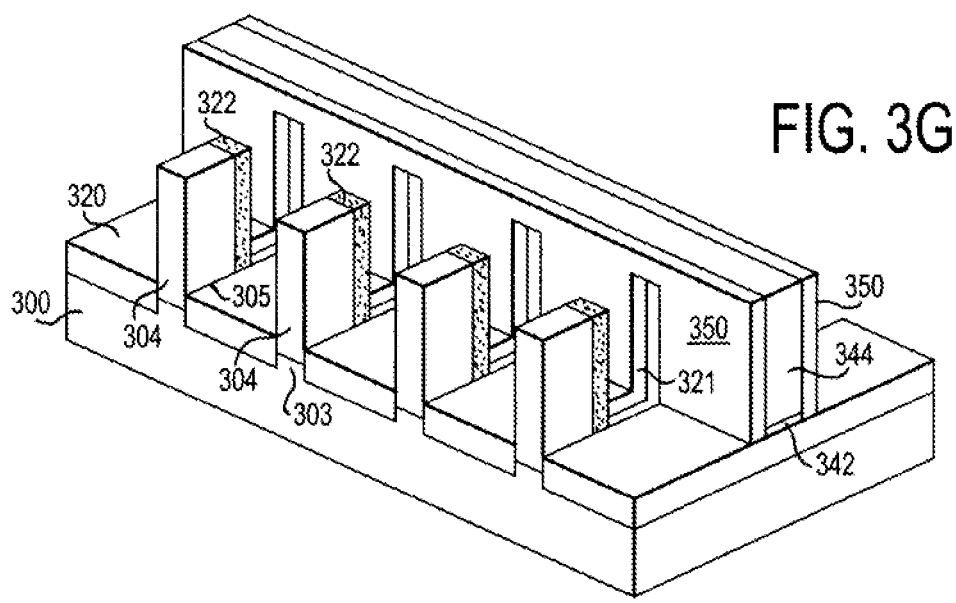
FIG. 3G
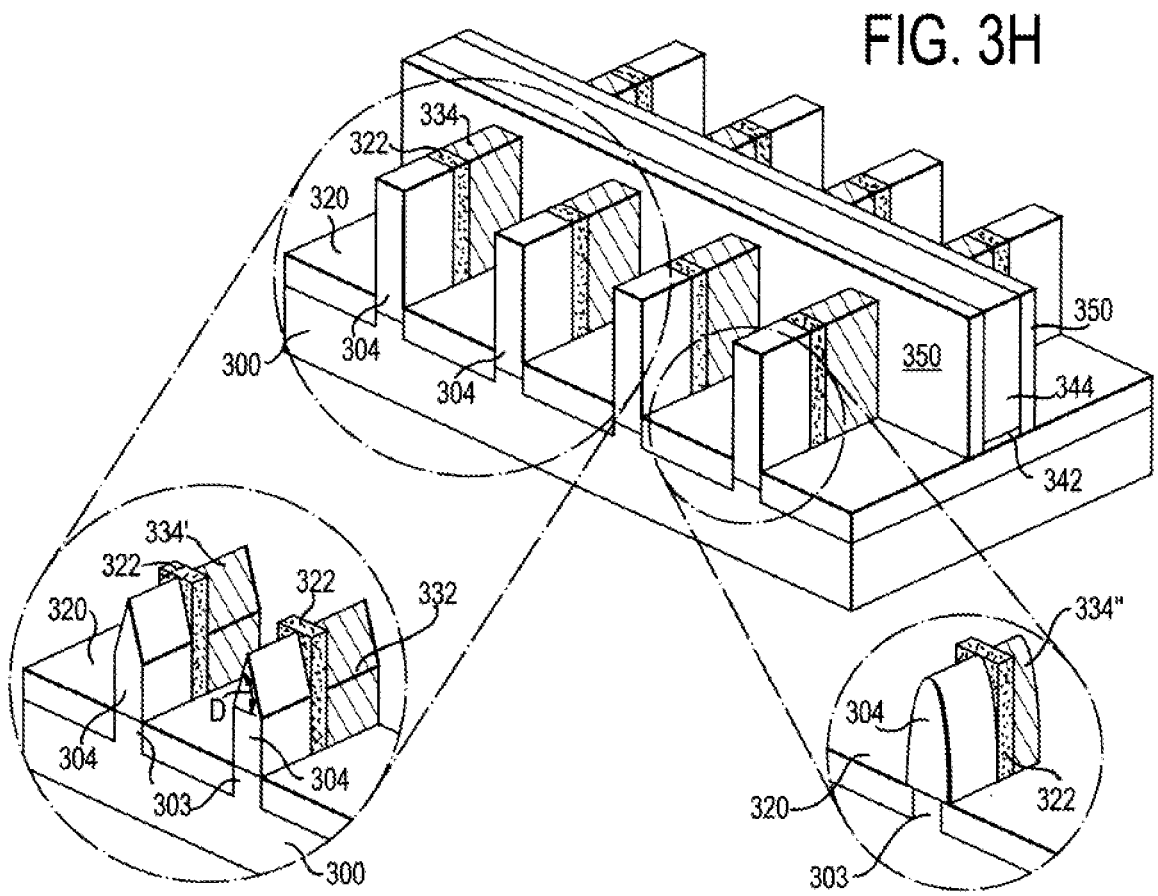
FIG. 3H
FIG. 3H'
FIG. 3H"

EPITAXIAL OXIDE PLUG FOR STRAINED TRANSISTORS

CROSS-REFERENCE TO RELATED APPLICATIONS

This patent application is a continuation of U.S. patent application Ser. No. 16/640,465, filed Feb. 20, 2020, which is a U.S. National Phase Application under 35 U.S.C. § 371 of International Application No. PCT/US2017/053582, filed on Sep. 27, 2017, the entire contents of which are hereby incorporated by reference herein.

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). Because the conductive channel of such configurations principally includes three different planar regions of the fin (e.g., top and two sides), such a FinFET design is sometimes referred to as a tri-gate transistor. Other types of FinFET configurations are also available, such as so-called double-gate FinFETs, in which the conductive channel principally includes the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on two or three planes (and thus, there are two or three effective gates), one or more nanowires are used for the channel region and the gate material generally surrounds each nanowire.

BRIEF DESCRIPTION OF THE DRAWINGS

FIGS. 3A-3M illustrate example IC structures formed when carrying out the methods of FIGS. 1 and 2, in accordance with some embodiments.

Figure 1:
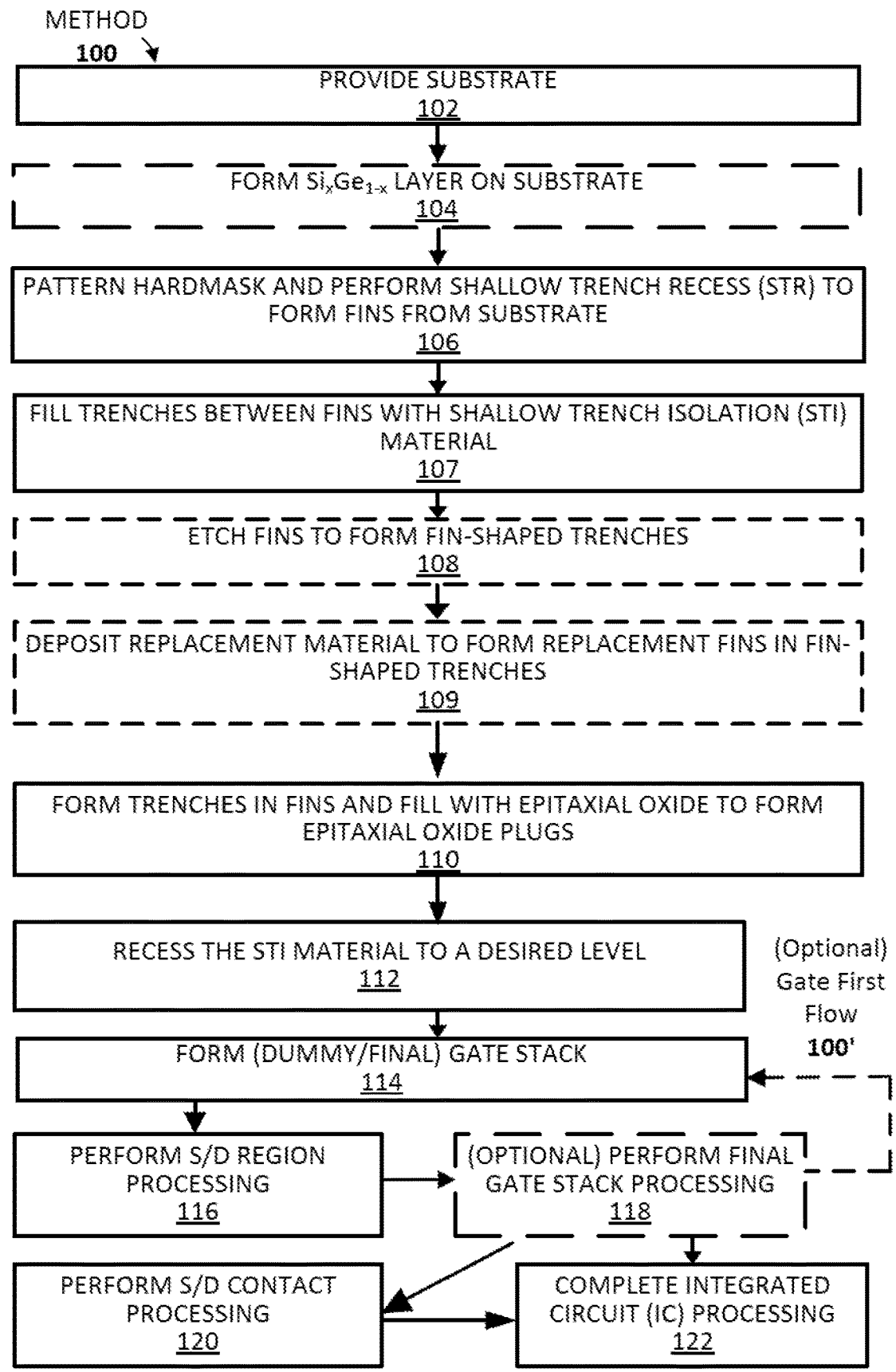
FIG. 1 illustrates a method of forming an integrated circuit (IC) including an epitaxial oxide plug for imposing, restoring, maintaining, and/or increasing strain in a channel region of an IC transistor, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are described for forming epitaxial oxide plugs proximate to source and/or drain (S/D) regions of transistor in an IC. In some embodiments, the epitaxial oxide plugs can be used to impose strain to a channel region of a transistor whether or not strain is formed in the channel region using other techniques (e.g., a lattice mismatch between the material of the channel region and an underlying substrate). In other embodiments, the epitaxial oxide plugs can be used to restore, maintain, and/or increase strain already present in a strained channel region. When used to impose, maintain, or increase strain in a channel region of a transistor, the charge carrier mobility within the channel region is increased, thus increasing the speed with which current flows through the transistor. This in turn improves the performance of the transistor and the integrated circuit as a whole. Numerous transistor configurations and variations will be apparent in light of this disclosure.

General Overview

Straining a channel region in a transistor can improve mobility of the charge carrier in the channel region, thus increasing the speed with which signals are transmitted from a source region to a drain region of the transistor. This, in turn, improves the performance of the transistor. Strain can be produced within a channel region by, for example, forming a $Si_xGe_{1-x}$ channel region on an underlying SiGe buffer layer (which can be disposed on or above an underlying Si substrate, in some examples). For example, a SiGe buffer layer may serve as a template for growing of one or both of a compressively strained p-MOS channel material and a tensile-strained n-MOS channel material to achieve gains in hole and electron mobility, respectively, in the channel regions of the devices. In one example, a SiGe buffer layer (e.g., having a composition of $Si_{0.7}Ge_{0.3}$) can serve as the template for the growth of compressively strained SiGe channel p-MOS devices (e.g., with 50% Ge content by atomic percentage or $Si_{0.5}Ge_{0.5}$) and/or tensile-strained Si channel n-MOS devices (e.g., with 25% Ge content by atomic percentage or $Si_{0.25}Ge_{0.75}$), thereby simultaneously achieving large gains in hole mobility for p-MOS devices and electron mobility for the n-MOS devices, which improves the performance of the devices. Other compositions of the buffer layer, the p-MOS channel region, and the n-MOS channel region can produce an analogous effect and can be selected based on whether one or both of the p-MOS and n-MOS channel regions is desired to be strained, among other factors. However, in some cases, some or all of the strain produced in a channel region can be lost as a result of IC processing performed after formation of the channel region. For example, channel region strain can be lost when, in the case of a finFET device, an unconstrained ("free") surface is created within the fin or created at a location adjacent to a semiconductor body that includes a channel region. In one possible example scenario, free surfaces can be created when portions of a fin adjacent to the semiconductor body (which is disposed underneath a gate stack or dummy gate stack) are removed prior to replacement with S/D material. In another possible example scenario, free surfaces can be created when portions of a fin corresponding to separate, but adjacent transistors on the same fin are electrically isolated from one another. In such an electrical isolation process, a portion of a fin can be removed (e.g., using patterning techniques such as photolithographic masking and etching), thus forming a trench within the trench and, as a result, creating a free surface of a fin. An amorphous dielectric plug (e.g., a silicon oxide or silicon nitride) can then be formed in the trench. Note, however, that this amorphous dielectric plug may electrically isolate transistors on a same fin from each other, but does not restore strain lost upon creation of the free surface or otherwise impose strain on the channel region. In other words, regardless of the origin, a free surface within a fin permits relaxation of some or all of the strain within the fin and/or the adjacent semiconductor body. In this way, some or all of the strain-induced improvement in charge carrier mobility is lost during fabrication of the transistor.

Thus, and in accordance with various embodiments of the present disclosure, techniques are provided for forming epitaxial oxide plugs proximate to S/D regions of a transistor, whether planar transistors or non-planar (e.g., finFET, nanowire) transistors. The epitaxial and coherent contact between a crystalline oxide plug and an adjacent fin portion can be used to either impart strain to an otherwise unstrained channel region (e.g., for a semiconductor body that is unstrained relative to an underlying buffer layer or substrate), or to restore, maintain, or increase strain within a channel region of a previously strained semiconductor body. In accordance with some embodiments described herein, the epitaxial crystalline oxide plugs can include crystalline oxides with a perovskite crystal structure and can include one or more of strontium (Sr), titanium (Ti), lanthanum (La), aluminum (Al), neodymium (Nd), or gadolinium (Gd). In a more general sense, the composition of the crystalline oxide can be selected so as to be epitaxially matched with the lattice of a corresponding fin portion with which the crystalline oxide is in contact. That is, for instance, the composition of the perovskite crystalline epitaxial oxide is selected to have a lattice parameter less than 1% different from a corresponding lattice parameter of the adjacent fin portion (whether formed of Si or $Si_xGe_{1-x}$), in some embodiments.

Architecture and Methodology

Figure 2:
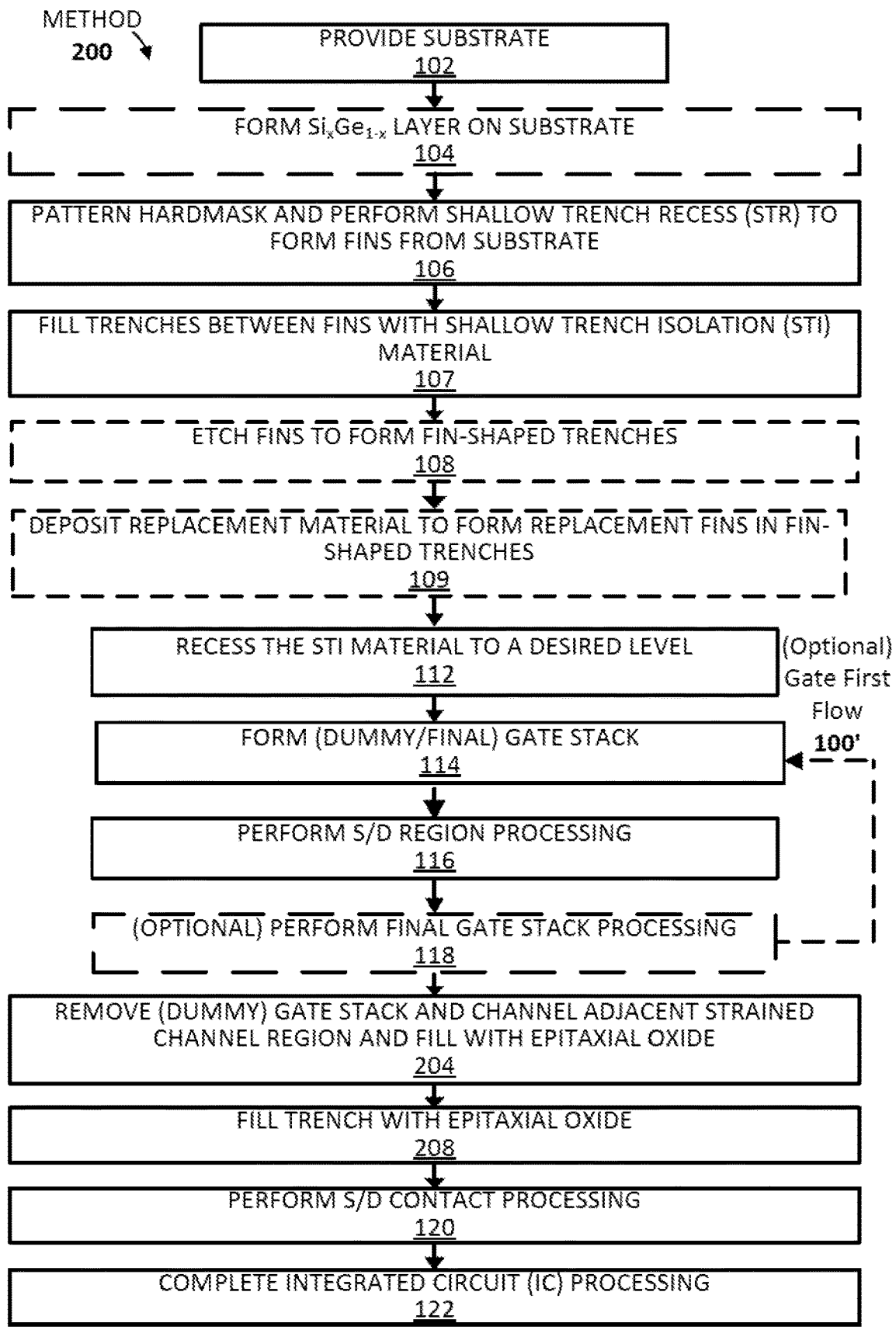
FIG. 2 illustrates an alternative method of forming an integrated circuit (IC) including an epitaxial oxide plug for imposing, restoring, maintaining, and/or increasing strain in a channel region of an IC transistor, in accordance with some embodiments of the present disclosure.

FIG. 1 illustrates a method 100 for forming an integrated circuit (IC) including an epitaxial oxide plug. As indicated above, the epitaxial oxide plug can, in some examples, impose, restore, maintain and/or increase strain within a channel region of a transistor semiconductor body, in some embodiments. FIGS. 3A-3I (and FIG. 3M, in part) illustrate example IC structures formed when carrying out the method 100 of FIG. 1, in accordance with some embodiments of the present disclosure. FIG. 2 illustrates a method 200 for forming an integrated circuit (IC) that includes an epitaxial oxide plug disposed between spacers fabricated as part of a dummy gate stack or gate stack process that is an alternative to the method 100. FIGS. 3J-3M illustrate example alternative IC structures corresponding to the method 200, in accordance with some embodiments of the present disclosure. Note that the formation of the epitaxial oxide plugs can be formed either before or after formation of (dummy) gate structures.

The techniques and structures described herein are primarily depicted and described in the context of forming finned or FinFET transistor configurations (e.g., tri-gate transistor configurations), for ease of illustration. However, in some embodiments, the techniques may be used to form transistors of any suitable geometry or configuration, as will be apparent in light of this disclosure. Also note that the techniques for forming the finned structures used in the channel region of one or more transistors may include blanket deposition techniques (e.g., using processes 102-109 to form structures illustrated in FIGS. 3A-3C), and/or any other suitable techniques as will be apparent in light of this disclosure. Further note that the methods 100 and 200 include a primary path that illustrates a gate last transistor fabrication process flow (e.g., a replacement gate process flow), which is utilized in some embodiments. However, in other embodiments, a gate first process flow may be used, as will be described herein (and which is illustrated with the alternative gate first flow 100' indicator in FIGS. 1 and 2). Numerous variations and configurations will be apparent in light of this disclosure.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. For instance, FIG. 3I illustrates an example IC structure including transistors having finned and nanowire configurations, as will be described in more detail below. Further, the techniques may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100 of FIG. 1 begins by providing 102 a substrate 300 on which various IC structures can be formed. Substrate 300, in some embodiments may include: a bulk substrate including group IV semiconductor material (e.g., Si, Ge, SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, substrate 300 may be doped with any suitable n-type and/or p-type dopant selected in light of the dopant used to dope replacement fins (as described herein). For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 300 may be undoped/intrinsic or relatively minimally doped (such as including a dopant concentration of less than 1E16 atoms per cubic cm), for example.

In some embodiments, substrate 300 may include a surface crystalline orientation described by a Miller index of (100), (110), or (111), or its equivalents, as will be apparent in light of this disclosure. Although substrate 300, in this example embodiment, is shown as having a thickness (dimension in the Y-axis direction) similar to other layers shown in subsequent structures for ease of illustration, in some instances, substrate 300 may be much thicker than the other layers, such as having a thickness in the range of 50 to 950 microns, for example, or any other suitable thickness as will be apparent in light of this disclosure.

In some embodiments, substrate 300 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Method 100 of FIG. 1 continues with optionally forming 104 a $Si_{1-x}Ge_x$ layer 301 (referred to simply as "SiGe layer 301") on the substrate 300, as shown in FIG. 3A', in accordance with some embodiments of the present disclosure. As indicated above, this SiGe layer 301 can be used as a buffer layer to form one or both of strained p-MOS or strained n-MOS semiconductor bodies that include a strained channel region. In some embodiments, the composition of the SiGe layer 301 can be selected to facilitate fabrication of both strained p-MOS and n-MOS strained channel region transistors in a CMOS integrated circuit.

In some embodiments, the SiGe layer 301 may be formed using any suitable processing, such as one or more of the aforementioned deposition/epitaxial growth processes (e.g., CVD, PVD, ALD, VPE, MBE, LPE) and/or any other suitable processing, as can be understood based on this disclosure. The SiGe layer 301, in some embodiments, may include alloying elements that include, but are not limited to, tin (Sn) and/or carbon (C). In other words, in some embodiments, the SiGe layer 301 is a monocrystalline group IV semiconductor material that at least includes germanium. In some embodiments, the SiGe layer 301 may or may not be doped with any suitable dopant (e.g., boron, phosphorous, and/or arsenic). In embodiments where the SiGe layer 301 is doped, it may be n-type doped (e.g., with phosphorous or arsenic) or p-type doped (e.g., with boron) at a dopant concentration in the range of 1E16 to 1E22 atoms per cubic cm, for example. The doping concentration and type of dopant can be selected so as to reduce current leakage from a source region to a drain region below the channel region. For example, n-type doping in a portion of the SiGe layer 301 corresponding to a p-MOS channel region can reduce "sub-fin" leakage through the SiGe layer 301 below the p-MOS channel region (not shown). Similarly, p-type doping in a portion of the SiGe layer 301 corresponding to an n-MOS channel region can reduce sub-fin leakage through the SiGe layer 301 below the n-MOS channel region (not shown). In some embodiments, SiGe layer 301 may include a multilayer structure including two or more distinct layers (that may or may not be compositionally different). In some embodiments, SiGe layer 301 may include grading (e.g., increasing and/or decreasing) of one or more material concentrations throughout at least a portion of the layer.

In some embodiments, the SiGe layer 301 may include a vertical thickness (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. In other examples, the SiGe layer 301 can be as thick as 3 □m. Other suitable materials and thickness values/ranges/thresholds will be apparent in light of this disclosure.

Method 100 of FIG. 1 continues patterning 106 hardmask on a substrate, such as patterning hardmask 310 on substrate 300 to form the example structure of FIG. 3A, in accordance with some embodiments. In some embodiments, hardmask 310 may be deposited or otherwise formed on substrate 300 using any suitable techniques as will be apparent in light of this disclosure. For example, hardmask 310 may be blanket deposited or otherwise grown on substrate 300 using chemical vapor deposition (CVD), atomic layer deposition (ALD), physical vapor deposition (PVD), spin-on processing, and/or any other suitable process to form hardmask 310 on substrate 300. In some instances, the top surface of substrate 300 on which hardmask 310 is to be deposited may be treated (e.g., via chemical treatment, thermal treatment, etc.) prior to deposition of the hardmask 310 material. After being blanket formed on substrate 300, hardmask 310 may then be patterned 106 using any suitable techniques, such as one or more lithography and etch processes, for example. Hardmask 310 may include any suitable material, such as oxide material, nitride material, and/or any other suitable dielectric/electrical insulator material, for example. Specific oxide and nitride materials may include silicon oxide, titanium oxide, hafnium oxide, aluminum oxide, silicon nitride, and titanium nitride, just to name a few examples. In some cases, the material of hardmask 310 may be selected based on the material of substrate 300, for example.

Figure 3B:
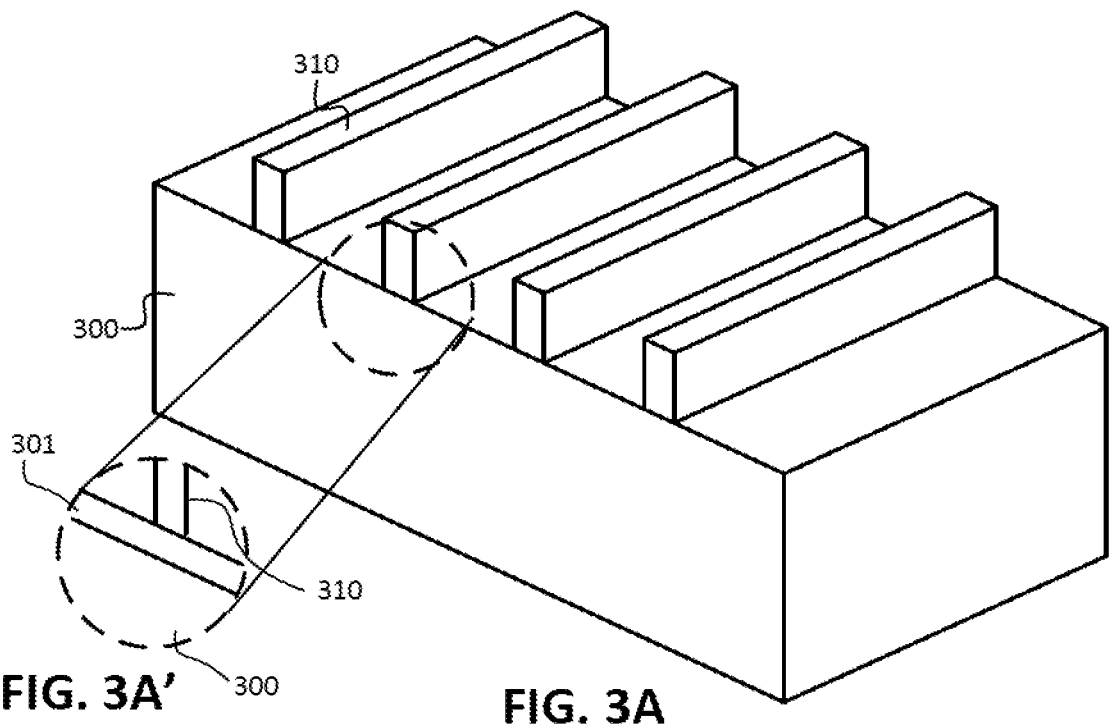
Figure 3B:
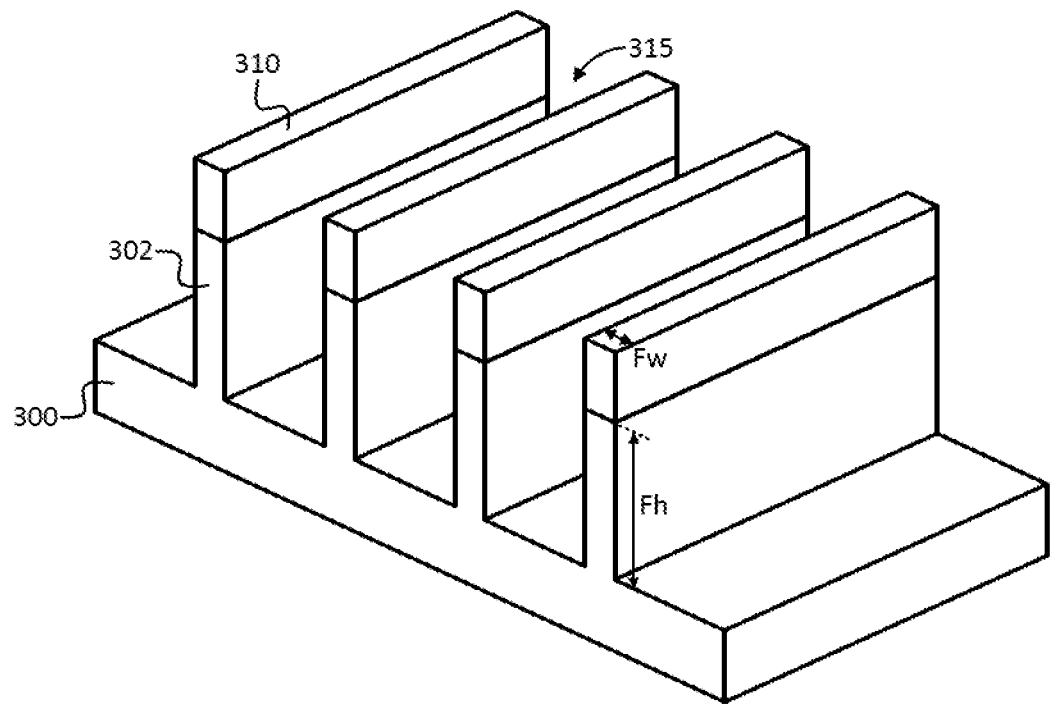
Figure 3I:
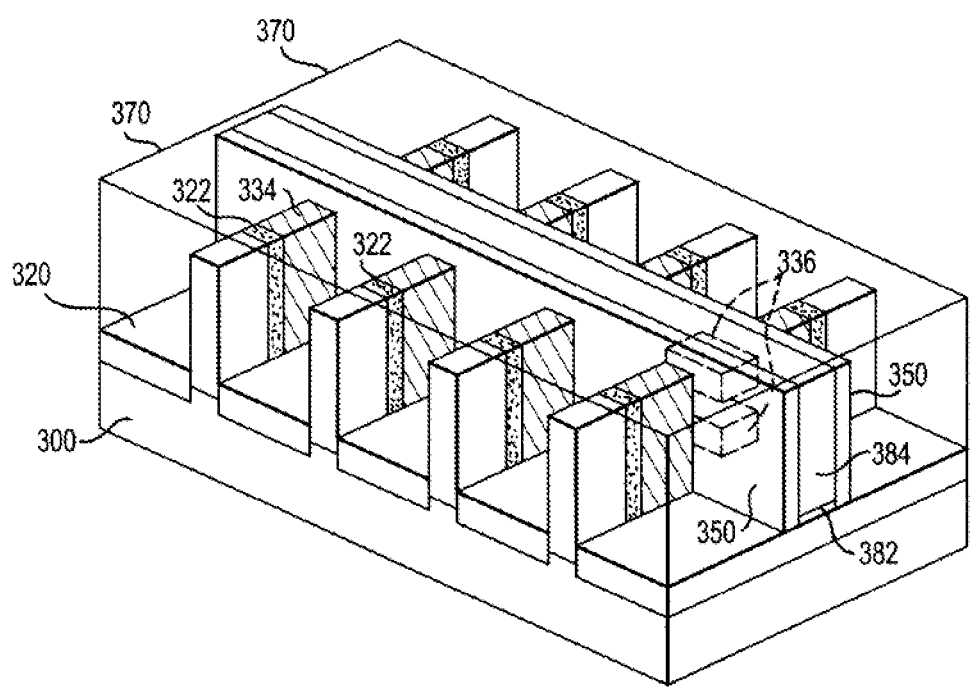

Shallow trench recess (STR) etch is performed 106 to form fins 302 from substrate 300, thereby forming the resulting example structure shown in FIG. 3B, in accordance with some embodiments. In some embodiments, the STR etch 106 used to form trenches 315 and fins 302 may include any suitable techniques, such as various masking processes and wet and/or dry etching processes, for example. In some cases, STR etch 106 may be performed in-situ/without air break, while in other cases, STR etch 106 may be performed ex-situ, for example. Trenches 315 may be formed with varying widths (dimension in the X-axis direction) and depths (dimension in the Y-axis direction) as can be understood based on this disclosure. For example, multiple hardmask patterning 106 and STR etching 106 processes may be performed to achieve varying depths in the trenches 315 between fins 302. Fins 302 may be formed to have varying widths Fw (dimension in the X-axis direction) and heights Fh (dimension in the Y-axis direction). For example, in a trench fill integration scheme, the fins may be formed to have particular height to width ratios. Note that although hardmask structures 310 are still present in the example structure of FIG. 3B, in some cases, that need not be the case, as they may have been consumed during the STR etch, for example. It will be appreciated that in some embodiments, the STR etch can be performed to form aspect ratio trapping (ART) trenches in the substrate 300 (or an overlying insulation layer). The ART trench can then be filled with a fin (of Si or any other material) to which the subsequently described fin processes can be applied.

In some embodiments, the fin widths Fw (labeled in FIG. 3B to show a dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh (labeled in FIG. 3B to show a dimension in the vertical or Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, 10, or 20 or greater than any other suitable threshold ratio, as will be apparent in light of this disclosure. Note that the trenches 315 and fins 302 are each shown as having essentially the same sizes and shapes in this example structure for ease of illustration; however, the present disclosure is not intended to be so limited. For example, in some embodiments, the fins 302 may be formed to have varying heights Fh, varying widths Fw, varying starting points (or varying starting heights), varying shapes, and/or any other suitable variations as will be apparent in light of this disclosure. Moreover, trenches 315 may be formed to have varying depths, varying widths, varying starting points (or varying starting depths), varying shapes, and/or any other suitable variations as will be apparent in light of this disclosure. Further note that although four fins 302 are shown in the example structure of FIG. 3B for ease of illustration, any number of fins may be formed, such as one, two, three, five, ten, hundreds, thousands, millions, billions, and so forth, as can be understood based on this disclosure.

Method 100 of FIG. 1 continues with filling 107 trenches 315 with shallow trench isolation (STI) material 320 and planarizing/polishing the structure to form the example resulting structure of FIG. 3C, in accordance with some embodiments. In some embodiments, filling 107 trenches 315 with STI material 320 may include any suitable deposition techniques, such as those described herein (e.g., CVD, ALD, PVD), or any other suitable deposition process. In some embodiments, STI material 320 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 320 may be selected based on the material of substrate 300. For instance, in the case of a Si substrate, the STI material may be selected to be silicon dioxide or silicon nitride, to provide some examples. In some embodiments, the planarizing and/or polishing process(es) performed after forming STI material 320 may include any suitable techniques, such as chemical-mechanical planarization/polishing (CMP) processes, for example.

In embodiments where the fins are optionally etched 108 and replaced 109 to form replacement semiconductor material (e.g., to be used in the channel region of one or more transistor devices), the structure of FIG. 3C enables such processing. For example, continuing from the structure of FIG. 3C, fins 302 may be etched 108, and thus recessed or removed, using selective etch processing. That is, for example, for a given etchant, the semiconductor material of fins 302 is etched 108 relative to the insulator material of STI layer 320 to form fin-shaped trenches between STI material 320. A replacement semiconductor material can be deposited/grown (or more generally "formed") 109 (e.g., using any suitable techniques, such as CVD, metal-organic CVD (MOCVD), ALD, molecular beam epitaxy (MBE), PVD). For instance, FIG. 3C' is a magnified view of a portion of FIG. 3C illustrating alternative recess and replace processing to form 109 a replacement material fin, in accordance with some embodiments. In FIG. 3C', replacement fin 330 was formed 109, and the replacement fin 330 (and generally, any replacement fin formed) may include any suitable semiconductor material (e.g., group IV and/or III-V semiconductor material). For instance, replacement fins including SiGe or Ge may be formed 109 by etching 108 native Si fins during such processing and replacing them with the SiGe or Ge material, to provide some examples. In addition, replacement fin 330 may include any suitable n-type or p-type dopant that is selected so that, ultimately, a source region and a drain region have an oppositely charged carrier to that of a substrate, as described herein. In some embodiments, replacement material fins, such as replacement fin 330 of FIG. 3C' may be formed using alternative processing. For instance, in some embodiments, replacement material fins may be formed 109 by blanket-growing the replacement material on the substrate (e.g., using epitaxial deposition processing) and then patterning the replacement material into replacement material fins, to provide an example alternative. Such an example alternative process may also include forming STI material between the replacement material fins to form 109 a structure similar to that shown in FIG. 3C', for instance. Note that replacement fin 330 is illustrated with patterning/shading to merely assist with visually identifying that feature.

Note that only one fin is shown being replaced in the example embodiment of FIG. 3C'; however, the present disclosure is not intended to be so limited. In some embodiments, all of the native fins 302 may be replaced or only a subset may be replaced (e.g., such that some replacement fins are available for subsequent processing and some native fins 302 remain for subsequent processing). Further, in some embodiments, the recess and replace process may be performed as many times as desired to form as many subsets of replacement fins as desired by masking off the areas not to be processes for each replacement fin subset processing. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing.

Note that the recess process used to form 109 replacement fin 330 includes recessing native fin 302 (i.e., native to substrate 300) to a depth as shown, such that a portion of that native fin 302 remains (indicated in FIG. 3C' as fin portion 303 or a so-called fin-stub).

Continuing with the scenario depicted in FIG. 3C', generally, in a trench fill integration scheme, the fins may be formed to have particular height to width ratios (e.g., at least 2-5) such that when they are later removed or recessed, the resulting trenches formed allow the replacement material deposited to grow vertically from the native underlying substrate and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example.

The method 100 continues by forming 110 trenches in the fins (whether native fins or replacement fins) and filling 110 the trenches with epitaxial oxide thus forming epitaxial oxide plugs 322, as shown in FIG. 3D. As indicated above, the epitaxial oxide plugs 322 impose, restore, maintain, and/or increase strain in a channel region of a transistor. Trenches can be formed 110 in the fins 302 or replacement fins 330 using any of the patterning techniques described herein, including the use of hardmasks, photolithographic masks in combination with any of a variety of etching techniques (e.g., reactive ion etching, wet chemical etching, among others).

The epitaxial oxide of the epitaxial oxide plug 322 can be formed 110 within the trench by CVD, ALD, or other vapor phase deposition technique. In some examples, formation 110 of the epitaxial oxide in the trench can be through deposition of a vapor having the final composition of the oxide itself. In other examples, formation 110 of the epitaxial oxide in the trench is accomplished by providing vapor phase precursors to the trenches in the fins 302 (or replacement fins 330), which then react in situ to form the final composition of the oxide of the plugs 322. In still another type of formation technique, formation 110 of the epitaxial oxide in the trench is accomplished by providing vapor phase molecules of the oxide final composition or reacting precursors in situ to form an amorphous phase of the oxide composition and then annealing the example structure illustrated in FIG. 3D. This annealing (e.g., in an inert atmosphere of argon or nitrogen and at a temperature at or below 800oC) can cause a transformation of the amorphous oxide composition into a crystalline (or monocrystalline) form. This transformation can, in some examples, facilitate the imposition of strain on the adjacent S/D region(s).

Regardless of the technique used, the crystal(s) of oxide in the plug 322 are epitaxial with the adjacent portions of the fin 302 (or replacement fin 330). Furthermore, the crystal(s) of oxide in the plug 322 are coherent with the crystal(s) of the adjacent fin 302 (or replacement fin 330). That is, there is a one to one correspondence between crystallographic planes of the epitaxial oxide crystal(s) and the adjacent crystal(s) of the source region or drain region. As indicated above, an epitaxial and coherent interface between the epitaxial oxide plug 322 and the adjacent portions of the fin 302 (or replacement fin 330) enables strain to be maintained or imposed on S/D regions, thus maintaining or imposing strain on a channel region of a semiconductor body adjacent to the strained S/D region.

In the example shown in FIG. 3D, two epitaxial oxide plugs 322 are shown disposed within the fin 302. As will be appreciated in light of descriptions herein, locations of one or more epitaxial oxide plugs 322 can be selected so as to be proximate to one or more of S/D regions so as to strain an associated channel region of a semiconductor body. The placement of the epitaxial oxide plugs 322 in the example illustrated in FIG. 3D for this purpose is further explained below. Furthermore, while only two epitaxial oxide plugs 322 are shown in this example, it will be appreciated that in other examples tens, hundreds, thousands, or tens or hundreds of thousands of epitaxial oxide plugs can be formed along an entire length of a fin, which can be used to form similar numbers of transistors that are electrically isolated from one another using oxide plugs and/or epitaxial oxide plugs of the present disclosure.

Method 100 of FIG. 1 continues with recessing 112 the STI material 320 to cause at least a portion 304 of fins 302 and corresponding oxide epitaxial plugs 322 to protrude from the STI plane, thereby forming the resulting example structure shown in FIG. 3E, in accordance with some embodiments. In some embodiments, recessing 112 may be performed using any suitable techniques, such as using one or more wet and/or dry etch processes that allow the STI material 320 to be selectively recessed relative to the material of fin 302, and/or any other suitable processing as will be apparent in light of this disclosure. As can be understood based on this disclosure, fin portions 304 may be used in the active channel region of one or more transistors, such that fin portions 304 (the portions of fins 302 above the top plane of STI layer 320 after recess 112 has been performed) may be referred to as active fin portions herein, for example.

As shown in FIG. 3E, the portions 304 of fins 302 exuding above the top plane of STI layer 320 have an active fin height indicated as Fah, which may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fah may be at least 25, 50, 75, 100, 125, 150, 175, 200, 300, 400, 500, 600, 700, or 800 nm tall, or greater than any other suitable threshold height as will be apparent in light of this disclosure. The active fin height is referred to as such because at least one portion of that fin (along the Z-axis) may be used in the channel region of a least one transistor, where the fin portion 303 (which is between two regions of STI material 320) is desired to not be a part of the channel region that includes the location for the active channel. FIG. 3E' is a magnified view of a portion of FIG. 3E illustrating the replacement fin 330 from FIG. 3C' after the STI material has been recessed, in accordance with some embodiments.

Method 100 of FIG. 1 continues with optionally forming 114 a dummy gate stack to form the example resulting structure of FIG. 3F, in accordance with some embodiments. Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 114 (forming a dummy gate stack) would not be performed, and thus, process 114 may be optional in some embodiments (such as those employing the gate first process flow). This is reflected with the alternative location for performing 120 final gate stack processing, which is shown as the optional gate first flow 100' in FIG. 1, where performing 120 the final gate stack processing would instead occur at the location of box 114 in embodiments employing a gate first process flow, for example. However, the description of method 100 will continue using a gate last process flow, to allow for such a flow (which generally includes additional processing) to be adequately described.

Continuing with forming 114 a dummy gate stack, such a dummy gate stack (where employed) may include dummy gate dielectric 342 and dummy gate electrode 344, thereby forming the example resulting structure of FIG. 3F, in this example embodiment. In this example embodiment, dummy gate dielectric 342 (e.g., dummy oxide material) and dummy gate electrode 344 (e.g., dummy poly-silicon material) may be used for a replacement gate process. Note that side-wall spacers 350, referred to generally as gate spacers (or simply, spacers), on either side of the dummy gate stack were also formed, and such spacers 350 can be used to help determine the channel length and/or to help with replacement gate processes, for example. As described below, the spacers 350 can also help with formation and placement of an epitaxial oxide plug of the present disclosure. As can be understood based on this disclosure, the dummy gate stack (and spacers 350) can help define the channel region and source/drain (S/D) regions of each fin, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration.

Formation of the dummy gate stack may include depositing the dummy gate dielectric material 342 and dummy gate electrode material 344, patterning the dummy gate stack, depositing gate spacer material 350, and performing a spacer etch to form the structure shown in FIG. 3F, for example. Spacers 350 may include any suitable material, such as any suitable electrical insulator, dielectric, oxide (e.g., silicon oxide), and/or nitride (e.g., silicon nitride) material, as will be apparent in light of this disclosure. It will be appreciated that while spacers 350 are shown herein as comprising a single (vertically oriented or horizontally oriented) layer, this need not be the case. In some examples, the spacers 350 can include more than one layer whether to tailor the electrical properties (e.g., dielectric constant) of the spacers 350 or to tailor one or more physical dimensions. Note that in some embodiments, as previously described, the techniques described herein need not include forming a dummy gate stack, such that a final gate stack may be formed in the first instance. Regardless, the end structure will include the final gate stack described herein, as will be apparent in light of this disclosure. Also note that in some embodiments, a hardmask may be formed over the dummy gate stack (which may or may not also be formed over spacers 350) to protect the dummy gate stack during subsequent processing, such as during contact precursor deposition as will be described below, for example. The previous relevant description of hardmask 310 is equally applicable to such a hardmask feature, where employed.

Method 100 of FIG. 1 continues with performing 116 the source/drain (S/D) region processing to form the example resulting structures of FIGS. 3G and 3H, in accordance with some embodiments. Performing 116 the processing includes, in this example embodiment, removing portions of fins 304 (or replacement fins 330, where employed) located in the S/D regions disposed between an epitaxial oxide plug 322 and the dummy gate stack (in this example embodiment) to form S/D trenches 321 that optionally extend below a top surface of the STI 320 into trench 305 as shown in the example resulting structure of FIG. 3G. As indicated above, disposing S/D regions within the trench 321 (and optional with a corresponding trench 305) enables the epitaxial oxide plug 322 to impose, maintain, or increase strain on an adjacent S/D region that can be transferred to a channel region of an adjacent semiconductor body.

In some embodiments, including the one shown in FIG. 3G, the trenches 305 can extend into the substrate 300. In some embodiments, removing the portions of fins 304 (or the portions of replacement fins 330, where employed) in the S/D regions may include any suitable techniques, such as one or more wet and/or dry etch processes, for example. Further, in some embodiments, replacing the S/D regions 304 (or 330) within the trench 321 defined by the epitaxial oxide plug 322 and the gate stack (or dummy gate stack) can be performing using any suitable techniques, such as one or more of the depositions processes described herein (e.g., CVD, MOCVD, ALD, PVD, MBE), and/or any other suitable processes as will be apparent in light of this disclosure. In some such embodiments, the replacement S/D regions 334 may be formed using a selective deposition process, e.g., such that the S/D material only or primarily grows (or only grows in a monocrystalline structure) from the exposed semiconductor material sub-fin portions 303, as can be understood based on this disclosure. Note that the S/D regions 334 are referred to herein as such for ease of description, but each S/D region 334 may be either a source region or a drain region, such that the corresponding S/D region (on the other side of the channel region, and thus, on the other side of the dummy gate stack) is the other of the source region and drain region, thereby forming a source and drain region pair. For instance, as shown in the resulting structure of FIG. 3H, there are four different S/D region 334 pairs.

Although replacement fin 334 was formed using the techniques described herein that employ a fin-shaped trench, in other embodiments, replacement fin 334' may be formed using alternative techniques, such as by blanket depositing the replacement material and forming the replacement material into fins, followed by STI processing, as previously described. For example, FIG. 3H' depicts an example embodiment in which a replacement fin 334' (only two of which are shown for convenience) is epitaxially grown from the fin portion 303. In the example shown, in which the fin portion 303 is {111} silicon, the epitaxially grown single crystal replacement fin 334' includes {111} crystallographic facets on the top surfaces, where one of those top surfaces of the S/D regions is indicated as 332 in FIG. 3H' (the other surface is behind the surface indicated as 332, which cannot be seen in the view of FIG. 3H'). In other words, the upper-most surfaces (e.g., the surfaces farthest from substrate 300) include {111} faceting, in this example embodiment. In some embodiments, a {111} crystallographic faceted surface 332 of a given S/D region 334' may be represented by that surface including a non-orthogonal angle (illustrated in FIG. 3H' as angle D) of approximately 54.7 degrees (plus/minus 5 degrees) relative to the (001) plane, the main plane of substrate 300, the top plane of substrate 300, and/or the top plane of STI layer 320, for example.

In some embodiments, the S/D regions may have different shapes. For instance, FIG. 3H" is an illustration of an alternative rounded S/D region 334" that may be formed, in accordance with some embodiments. As shown, rounded S/D region 334" includes a rounded and unfaceted top, and the rounded or curved S/D region 334" also extends past the underlying sub-fin portion 303 in the X-axis direction. As can be understood based on this disclosure, S/D regions including any shape (such as the diamond shape of S/D regions 334' or the rounded shape of S/D region 334") can benefit from conformal, crystalline S/D contacts as described herein.

Regardless of the shape of the replacement S/D region, in some embodiments, the S/D regions 334 may include any suitable semiconductor material as will be apparent in light of this disclosure, such as monocrystalline group IV semiconductor material. For instance, a given S/D region may include Ge-rich material, such as Ge or SiGe with at least 50% Ge concentration (by atomic percentage). Thus, in such embodiments where a given S/D region includes Ge-rich material, the Ge concentration may be in the range of 50-100% (or in any suitable subrange, such as in the subrange of 50-60, 50-70, 50-80, 50-90, 60-70, 60-80, 60-90, 60-100, 70-80, 70-90, 70-100, 80-90, 80-100, or 90-100%), or any other suitable value or range as will be apparent in light of this disclosure. The replacement S/D region may also include any one or more of In, Ga, As, Al, Si, Ge, Sn, among other elements.

In some embodiments, S/D regions 334 may include semiconductor material that is or may not include n-type doped and/or p-type dopant. Where present, the dopant may be included in a concentration in the range of 1E17 to 5E22 atoms per cubic centimeter, for example. In some embodiments, a given S/D region may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region may be graded such that it is lower near the corresponding channel region and higher near the {111} faceted surfaces, corresponding S/D contact, which may be achieved using any suitable processing, such as tuning the amount of dopant in the reactant flow (e.g., during an in-situ doping scheme). In some embodiments, a given S/D region may include a multilayer structure that includes at least two compositionally different material layers. For instance, in the case of a FFFET device, the source region may include a multilayer structure that includes a p-type doped region and n-type doped region, in accordance with some embodiments. In some embodiments, a given S/D region may be raised such that it extends higher than a corresponding channel region (e.g., in the vertical or Y-axis direction).

In other example embodiments, the S/D region can include various III-V or II-VI compositions, including but not limited to InGaAs, InP, among others.

Note that the features of the S/D regions 334 are shown with patterning to merely assist with visual identification of the different features in the figures. Also note that the S/D regions 334 are all shown as including the same sizes/shapes in the example structures, for ease of illustration; however, the present disclosure is not intended to be so limited. The patterning and sizing of any of the features in the figures is not intended to limit the present disclosure in any manner. Also note that S/D regions 334 are all shown as including the same material and sizes/shapes in the example structure of FIG. 3H, for ease of illustration; however, the present disclosure is not intended to be so limited. For example, in some embodiments, one of the S/D regions 334 in a corresponding S/D region pair (such as region 334 on one side of the dummy gate stack) may be processed separately than the other S/D region in that pair (on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type S/D region may be processed separately from the p-type S/D region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (such as both including the same Ge-rich material). However, in other embodiments, a given S/D region may include a different material composition (e.g., at least 1, 2, 3, 4, 5, or 10% different) relative to the corresponding/adjacent channel region, for example.

Method 100 of FIG. 1 continues with performing 118 the final gate stack processing to form the example resulting structure of FIG. 3I, in accordance with some embodiments. As shown, the processing in this example embodiment included depositing interlayer dielectric (ILD) layer 370 on the structure of FIG. 3H, followed by planarization and/or polishing (e.g., CMP) to reveal the dummy gate stack. Note that ILD layer 370 is shown as transparent in the example structure of FIG. 3I to allow for the underlying features to be seen; however, the present disclosure is not intended to be so limited. Also note that ILD layer 370 may include a multilayer structure, even though it is illustrated as a single layer. Further note that in some cases, ILD layer 370 and STI material 320 may not include a distinct interface as shown in FIG. 3H, particularly where, e.g., the ILD layer 370 and STI material 320 include the same dielectric material (e.g., where both include silicon dioxide). In some embodiments, the ILD layer 370 may include any desired electrical insulator, dielectric, oxide (e.g., silicon oxide), and/or nitride (e.g., silicon nitride) material, as will be apparent in light of this disclosure.

The final gate stack processing 118, in this example embodiment, continues with removing the dummy gate stack (including dummy gate 344 and dummy gate dielectric 342) to allow for the final gate stack to be formed. The final gate stack is shown in FIG. 3I. As shown in FIG. 3I, the formation of the final gate stack, which includes gate dielectric 382 and gate electrode 384, may be performed using a gate first flow (also called up-front hi-k gate). In such embodiments, the final gate stack processing may have been alternatively performed as indicated by optional gate first flow 100' in the method 100, instead of forming a dummy gate stack. However, in this example embodiment, the final gate stack is formed using a gate last flow (also called a replacement gate or replacement metal gate (RMG) process). Regardless of whether gate first or gate last processing is employed, the final gate stack can include gate dielectric 382 and gate electrode 384 as shown in FIG. 3I and described herein. It will be appreciated that the gate dielectric 382 may include one or more layers. For example, the gate dielectric 382 can include at least one of a native oxide forming on the channel region of the fin and at least one additional dielectric layer.

Note that when the dummy gate is removed, the channel region of fins 304 (or replacement material fins 330), which is the portion of the fins that were covered by the dummy gate stack (referred herein as a "semiconductor body"), are exposed to allow for any desired processing of those channel regions. Such processing of a given channel region may include various different techniques, such as removing and replacing the channel region with replacement material, doping the channel region as desired, forming the channel region into one or more nanowires (or nanoribbons) for a gate-all-around (GAA) transistor configuration, forming the channel region into a beaded-fin configuration, cleaning/polishing the channel region, and/or any other suitable processing as will be apparent in light of this disclosure. For instance, a channel region corresponding to fins 334 in FIG. 3I is illustrated (which is the channel region of the left-most of the four original finned structures) and that finned channel region may be a portion of replacement material fin 330 and/or it may have been processed in any suitable manner (e.g., removed and replaced with other replacement material, doped in a desired manner, etc.). To provide another example, nanowire channel region 336 (which is the channel region of the right-most of the four original finned structures) may have been formed after the dummy gate was removed and the channel regions of the fins were exposed, by converting the finned structure at that location into the nanowires 336 shown using any suitable techniques, for example. For instance, the original finned channel region may have included a multilayer structure, where one or more of the layers were sacrificial and were selectively etched to remove those sacrificial layers and release the nanowires 336. As shown in FIG. 3I, nanowire channel region 336 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration.

As can be understood based on this disclosure, the channel region is at least below the gate stack, in this example embodiment. For instance, in the case of a finned transistor configuration, the channel region may be below and between the gate stack, as the stack is formed on three sides of the semiconductor body, as is known in the art. However, if the transistor device were inverted and bonded to what will be the end substrate, then the channel region may be above the gate. Therefore, in general, the gate and channel relationship may include a proximate relationship (which may or may not include one or more intervening gate dielectric layers and/or other suitable layers), where the gate is near the channel region such that it can exert control over the channel region in some manner (e.g., in an electrical manner), in accordance with some embodiments. Further, in the case of a nanowire (or nanoribbon or GAA) transistor configuration, the gate stack may completely surround each nanowire/nanoribbon in the channel region (or at least substantially surround each nanowire, such as surrounding at least 70, 80, or 90% of each nanowire). Further still, in the case of a planar transistor configuration, the gate stack may simply be above the channel region. In some embodiments, the channel region may include group IV semiconductor material (e.g., Si, SiGe, Ge), group III-V semiconductor material (e.g., GaAs, InGaAs, InAs), and/or any other suitable material as will be apparent in light of this disclosure. In some embodiments, the channel region may be doped (e.g., with any suitable n-type and/or p-type dopant) or intrinsic/undoped (or nominally undoped), depending on the particular configuration. For instance, in some such embodiments, the channel region may include Ge-rich material (e.g., Ge or SiGe with at least 50% Ge concentration) which may or may not be doped as desired (e.g., it may be doped with p-type dopant), to provide some examples.

Note that S/D regions 334 are adjacent to either side of a corresponding channel region, as can be seen in FIG. 3I, for example. More specifically, the S/D regions 334 are directly adjacent to a corresponding channel region, such that there are no intervening layers between either of the S/D regions and the channel region, in this example embodiment. However, the present disclosure is not intended to be so limited. Also note that the configuration/geometry of a transistor formed using the techniques described herein may primarily be described based on the shape of the respective channel region of that transistor. For instance, a nanowire (or nanoribbon or GAA) transistor may be referred to as such because it includes one or more nanowires (or nanoribbons) in the channel region of that transistor and because the gate stack (including the gate) wraps around (or at least substantially wraps around) each nanowire (or nanoribbon). However, the transistor type (e.g., MOSFET, TFET, FFFET, or other suitable type) may be described based on the doping and/or operating scheme of the source, channel, and drain regions, and thus those respective regions may be used to determine the type or classification of a given transistor, for example. For instance, MOSFET and TFET transistors may structurally be very similar (or the same), but they include different doping schemes (e.g., source-drain doping schemes for MOSFET of p-p or n-n versus p-n or n-p for TFET).

Continuing with performing 118 final gate stack processing, after the dummy gate has been removed and any desired channel region processing has been performed, the final gate stack can then be formed, in accordance with some embodiments. In this example embodiment, the final gate stack includes gate dielectric 382 and gate electrode 384, as shown in FIG. 3I. The gate dielectric 382 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 382 to improve its quality when high-k dielectric material is used. The gate electrode 384 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric 382 and/or gate electrode 384 may include a multilayer structure of two or more material layers, for example. In some embodiments, gate dielectric 382 and/or gate electrode 384 may include grading (e.g., increasing and/or decreasing) the content/concentration of one or more materials in at least a portion of the feature(s). Additional layers may be present in the final gate stack, in some embodiments, such as one or more work function layers or other suitable layers, for example. Note that although gate dielectric 382 is only shown below gate electrode 384 in the example embodiment of FIG. 3H, in other embodiments, the gate dielectric 382 may also be present on one or both sides of gate electrode 384, such that the gate dielectric 382 may also be between gate electrode 384 and one or both of spacers 350, for example. Numerous different gate stack configurations will be apparent in light of this disclosure.

Method 100 of FIG. 1 continues with performing 120 S/D contact processing, in accordance with some embodiments. In some embodiments, S/D contacts may be formed using any suitable techniques, such as forming contact trenches in ILD layer 370 over the respective S/D regions 334 and depositing metal or metal alloy (or other suitable electrically conductive material) in the trenches. In some embodiments, S/D contact formation may include silicidation, germanidation, III-V-idation, and/or annealing processes, for example. In some embodiments, S/D contacts may include aluminum or tungsten, although any suitable conductive metal or alloy can be used, such as silver, nickel-platinum, or nickel-aluminum, for example. In some embodiments, one or more of the S/D contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired. In some embodiments, a contact resistance reducing layer may be present between a given S/D region 334 and its corresponding S/D contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region, for example.

Method 100 of FIG. 1 continues with completing 122 general integrating circuit (IC) processing as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes 102-122 in method 100 of FIG. 1 are shown in a particular order for ease of description. However, one or more of the processes may be performed in a different order or may not be performed at all (and thus be optional), in accordance with some embodiments. Numerous variations on method 100 and the techniques described herein will be apparent in light of this disclosure.

Alternative Technique and Architecture

Figure 3J:
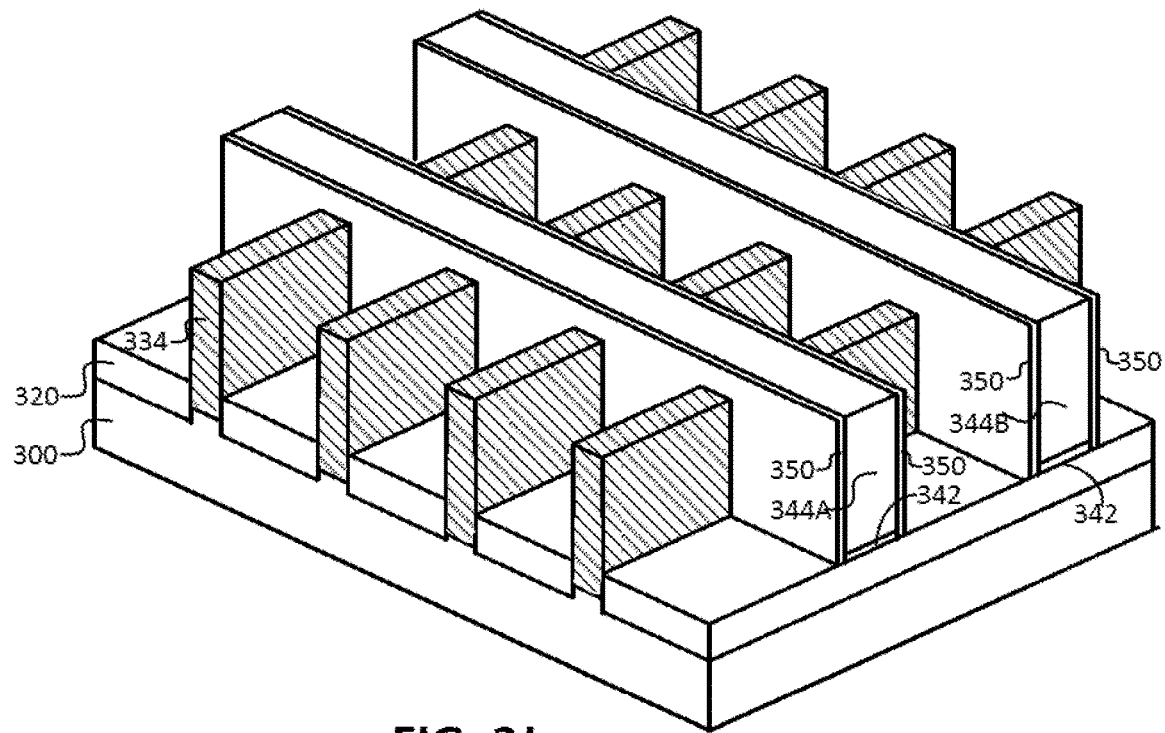
Figure 3K:
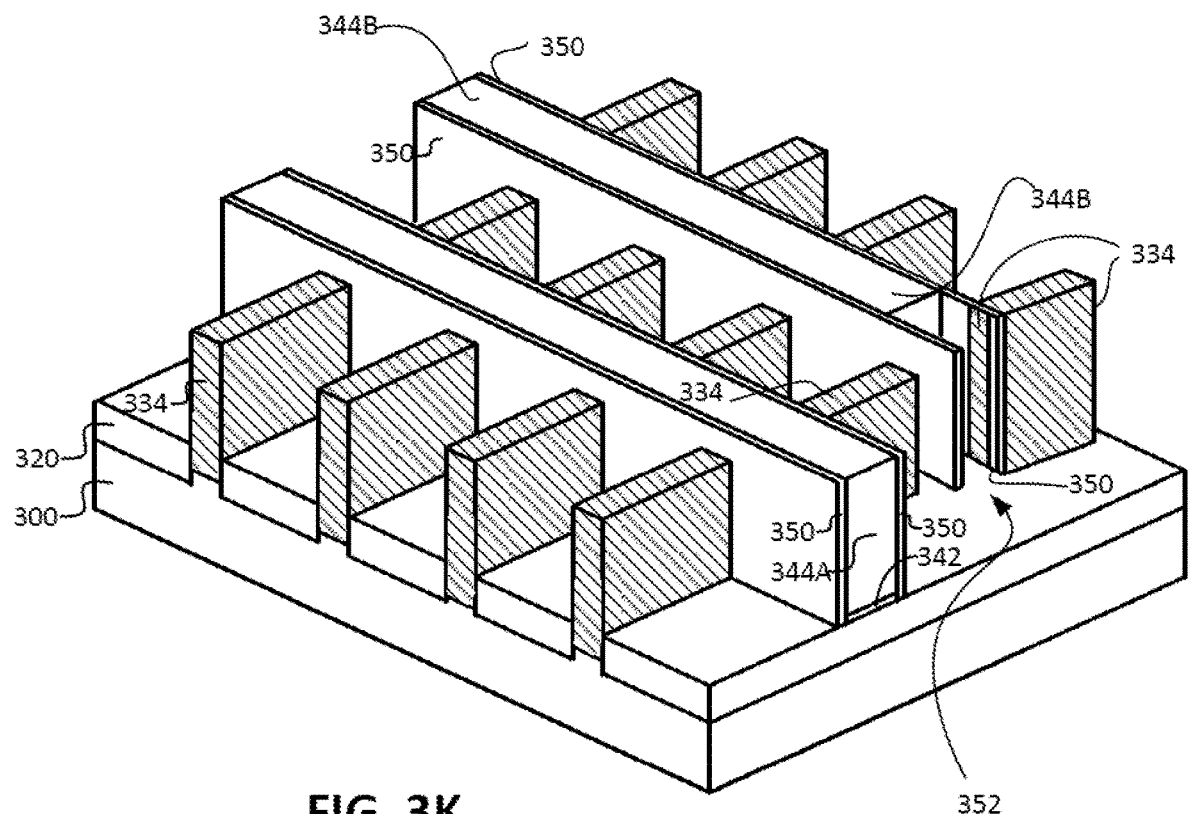
Figure 3L:
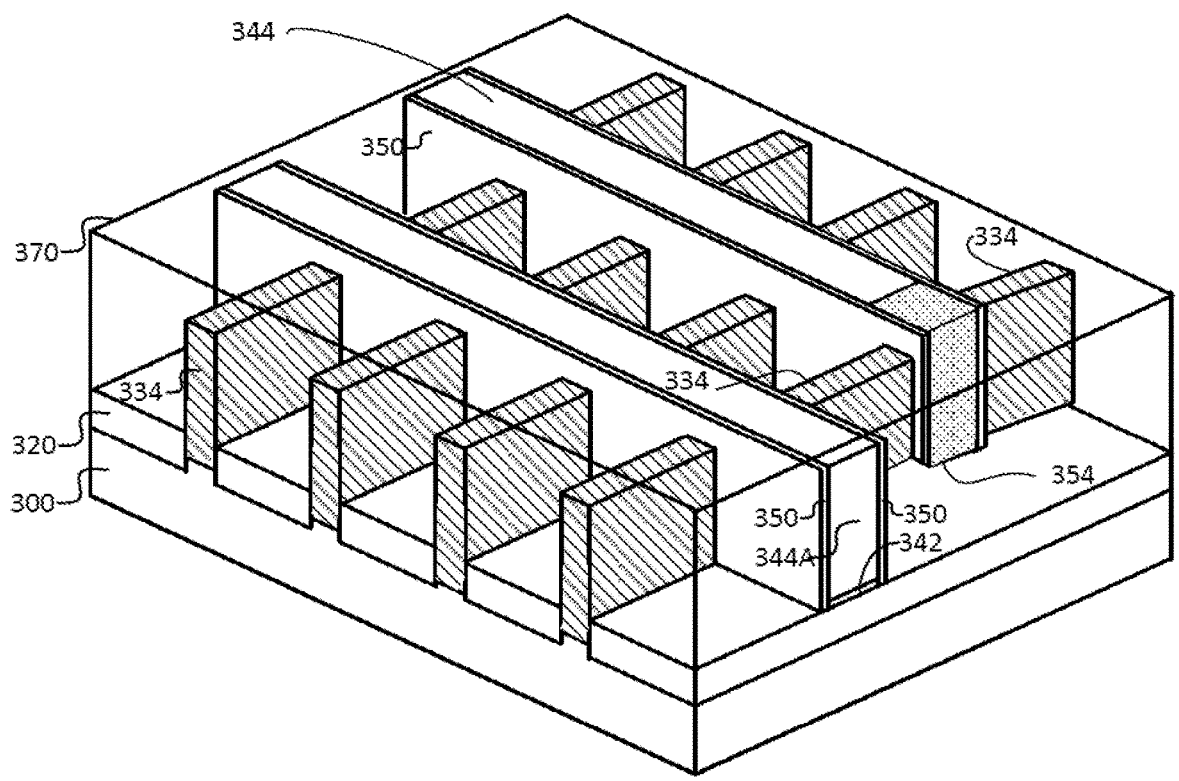

The example method 200 depicted in FIG. 2, and corresponding example architecture views shown in FIGS. 3J, 3K, and 3L, illustrate an alternative to the method 100 described above for imposing strain on a channel region of a semiconductor body using an epitaxial oxide plug. Rather than remove a portion of a fin 302 (or replacement fin 334) so as to form a trench 321 in which to form an epitaxial oxide plug 322, the example method 200 includes removal of a semiconductor body within a gate stack or dummy gate stack, removal of a gate stack or removal of a dummy gate stack and replacement thereof with epitaxial oxide plug.

Many of the elements of the method 200 are analogous to those of the method 100. For example, the method 200 includes provision 102 of a substrate, optional formation 104 of a relaxed SiGe layer on the substrate, patterning 106 a hardmask to form fins from the substrate, filling 107 trenches between fins with STI, among various other elements that will be apparent upon inspection of FIG. 2 relative to FIG. 1. These analogous elements, which are apparent upon comparison of FIGS. 1 and 2, need no further description.

Unlike the method 100, however, the method 200 does not include forming 110 trenches in fins that are filled with epitaxial oxide, as described above in the context of the method 100. Instead, the method 200 proceeds through formation 114 of a dummy gate stack and performance 116 of S/D region processing or through formation 118 of a final gate stack, using the techniques already described above. Conducting the method 200 up to this point produces the structures illustrated in FIG. 3J and previously described. The example structure illustrated in FIG. 3J shows two dummy gate stacks, each of which include spacers 350, dummy gate oxide 342, and a dummy gate electrode 344 (344A and 344B). The example structure in FIG. 3J is presented with two (dummy) gate stacks because the method 200 includes removing 204 portions of one of the two (dummy) gate stacks and replacement with epitaxial oxide, so as to impart, maintain, or increase strain on an adjacent S/D region of a proximate semiconductor body.

It will be appreciated that alternative embodiments of the method 200 can be performed using analogous techniques on a final gate structure, and that the dummy gate structure in FIG. 3J is selected for convenience of explanation.

The method 200 continues with the removal 204 of portions of, in the example of FIG. 3J, the dummy gate stack as illustrated in FIG. 3K. As shown, removal 204 of a portion of the dummy gate electrode 344B and, in this example, the corresponding dummy gate oxide 342 may leave spacers 350 defining a trench 352 (in other embodiments the spacers can be removed, leaving a trench 352 defined by the adjacent S/D regions). The trench 352 exposes end surface of S/D regions 334 and optionally a portion of an underlying substrate 300. This enables a coherent, epitaxial connection between the epitaxial oxide plug, as described below, with one or more of S/D regions 334 and the underlying substrate 300. Removal of the dummy gate electrode 344B and the dummy gate oxide 342 can be performed using any of the patterning and/or etching techniques described above. It will also be appreciated that in some cases, the S/D regions 334 are protected or encapsulated by ILD, a hardmask, or otherwise covered with a photolithographic mask to prevent unintentional removal of S/D region 334 material during removal 204 of the dummy gate electrode 344 and the dummy gate oxide 342. This encapsulating ILD and/or protective mask is omitted from FIG. 3K for clarity of depiction.

An epitaxial oxide plug 354 is then formed within the trench 352 using any of the techniques described above to form a coherent and epitaxial interface with the S/D regions 334, as shown in FIG. 3L. It will be appreciated that spacers 350 associated with gate electrode 344B are shown in FIG. 3K as shortened in length compared to FIG. 3J and the spacers associated with gate electrode 344A. In the example shown, this effect is purely for convenience of depiction and may or may not instantiated as a result of the techniques described herein. As described above, the epitaxial oxide plug 354 imparts, maintains, or increases strain on a proximate semiconductor body (e.g., under gate oxide 344A). One benefit of the method 200 is the use of the (dummy) gate structure as a template for epitaxial oxide formation, thus enabling use of IC gate pitches and dimensions for epitaxial oxide plugs that can be smaller than those using other techniques.

The method 200 continues with S/D contact processing 120 and integrated circuit processing 122 can be performed as previously described. ILD layer 370 is also shown in FIG. 3L, analogous to the ILD layer 370 shown in FIG. 3I. As indicated above, it will be appreciated that this ILD layer 370 may be present at an earlier stage of processing (e.g., prior to the processing illustrated in FIG. 3K) so that the ILD layer 370 protects S/D regions 334 from etching used to remove gate electrode 334B.

Figure 3M:
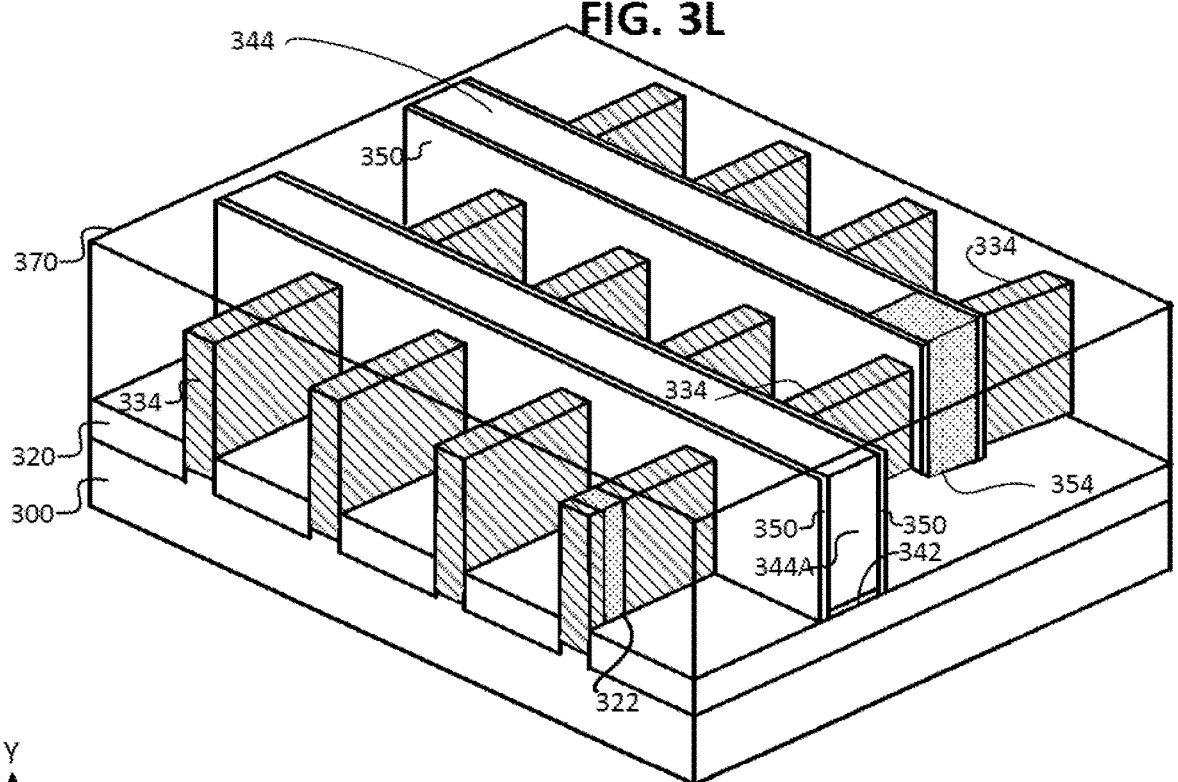

Furthermore, it will be appreciated that the methods 100 and 200 can be combined so that epitaxial oxide plugs are formed both within S/D regions and within spacers 350 corresponding to a (dummy) gate electrode. That is, the method 100 can be performed so as to include elements 204 and 208 from the method 200 (or alternatively, the method 200 can be performed so as to include the element 110). An illustration of this structure is shown in FIG. 3M.

Thicknesses of epitaxial oxide plugs, whether plug 322 or plug 354 can be selected independent from one another and can range from a width of 90 nm or less to as much as 400 nm. In other embodiments, the thickness can vary within any of the following ranges: 100 nm to 200 nm; 200 nm to 400 nm; 150 nm to 300 nm. Spacing between epitaxial oxide plugs can be from 5 nm to 70 nm, from 20 nm to 50 nm, or from 50 nm to 70 nm. Generally, the wider an epitaxial oxide plug, the more strain is provided to the channel region. In some examples, an epitaxial oxide plug (whether the plug 322 or the plug 354) that is on the order of 300 nm to 400 nm thick (in the X-dimension shown in FIG. 3M) can impose as much as 2% strain on the channel region (corresponding to a stress of over 3.5 GPa). It will be appreciated that a desired improvement in carrier mobility can be selected by selecting a thickness of epitaxial oxide plug. Furthermore, as is shown in FIG. 3M, it will be appreciated that a width (in the X direction as shown in FIG. 3M) of plug 354 and 322 can be different. In another embodiment this dimension can be the same between Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; atom probe tomography (APT); or high resolution physical or chemical analysis, to name a few suitable example analytical tools. In particular, in some embodiments, such tools may be used to detect compositions, crystallinity, and crystal structures of one or more of the epitaxial oxide plugs variously described herein, and/or to detect the presence of an epitaxial oxide plug between (dummy) gate spacers.

Example System

Figure 4:
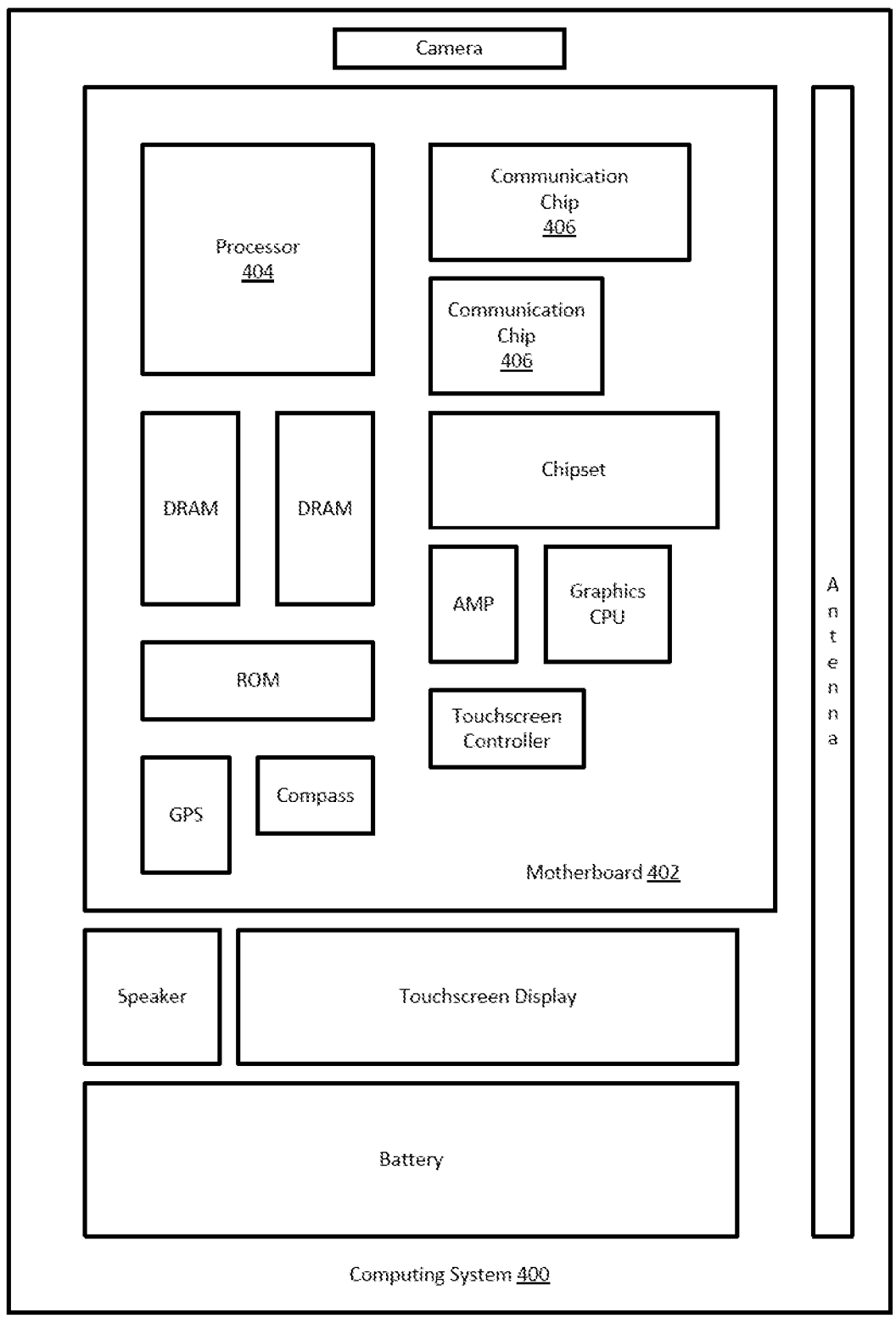
FIG. 4 illustrates a computing system implemented with integrated circuit structures and/or transistor devices formed using the techniques disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., to include one or more transistors including a strained channel region and a corresponding epitaxial oxide plug). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having an epitaxial oxide plug and a corresponding transistor with a strained channel region as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device comprising: a semiconductor body; a gate structure above the semiconductor body and on opposing sidewalls of the semiconductor body; a source region and a drain region adjacent to, and on opposing sides of, the semiconductor body, the source and drain regions comprising a semiconductor composition that is distinct from the semiconductor body; and an oxide plug adjacent to one of the source region and the drain region, the oxide plug having a perovskite crystal structure.

Example 2 includes the subject matter of Example 1, wherein the oxide plug comprises oxygen and at least one of strontium, titanium, lanthanum, aluminum, neodymium, and gadolinium.

Example 3 includes the subject matter of Example 1 or 2, wherein the oxide plug has a first lattice parameter that is less than 1% different from a second lattice parameter of the adjacent one of the source region and the drain region.

Example 4 includes the subject matter of any of the preceding Examples, wherein the oxide plug comprises a first plurality of crystallographic planes that are coherent with a second plurality of crystallographic planes of the adjacent one of the source region and the drain region.

Example 5 includes the subject matter of any of the preceding Examples, wherein the oxide plug causes from 0.5% to 2% of strain of a third lattice parameter in a channel region of the semiconductor body.

Example 6 includes the subject matter of Example 5, wherein the third lattice parameter of the channel region of the semiconductor body is less than 1% different from a fourth lattice parameter of a substrate below the semiconductor body.

Example 7 includes the subject matter of Example 5, wherein the semiconductor body comprises a p-MOS channel material and the strain comprises compressive strain of the third lattice parameter of the p-MOS channel material.

Example 8 includes the subject matter of Example 7, wherein the p-MOS channel material comprises silicon and germanium.

Example 9 includes the subject matter of Example 8, further comprising a layer of from 70 atomic % to 75 atomic % silicon and 25 atomic % to 30 atomic % germanium under the semiconductor body, the source region, and the drain region, wherein the p-MOS channel material comprises more than 50 atomic % germanium.

Example 10 includes the subject matter of Example 5, wherein the semiconductor body comprises an n-MOS channel material and the strain comprises tensile strain of the third lattice parameter of the n-MOS channel material.

Example 11 includes the subject matter of Example 10, wherein the n-MOS channel material comprises silicon.

Example 12 includes the subject matter of Example 11, further comprising a layer of from 70 atomic % to 75 atomic % silicon and 25 atomic % to 30 atomic % germanium under the semiconductor body, the source region, and the drain region, wherein the n-MOS channel material comprises less than 25 atomic % germanium.

Example 13 includes the subject matter of any of the preceding Examples, further comprising a first spacer in contact with the adjacent one of the source region and the drain region and a second spacer, wherein the oxide plug is between the first spacer and the second spacer.

Example 14 includes the subject matter of any of the preceding Examples, wherein the semiconductor body comprises indium and phosphorous.

Example 15 includes the subject matter of Example 14, wherein the source region and the drain region comprise indium, gallium, and arsenic.

Example 16 includes the subject matter of any of the preceding Examples, further comprising a substrate under the semiconductor body, the substrate comprising a fourth lattice parameter, and wherein a channel region of the semiconductor body comprises a third lattice parameter that is less than 1% different from the fourth lattice parameter.

Example 17 includes the subject matter of any of the preceding Examples, further comprising a substrate under the semiconductor body and a buffer layer between the substrate and the semiconductor body, the buffer layer and the semiconductor body having lattice parameters more than 1% different from one another.

Example 18 is a computing device that includes the subject matter of any of the preceding Examples.

Example 19 is a method for forming an integrated circuit structure, the method comprising: forming a semiconductor body on a substrate; forming a source region having a first end proximate to a first side of the semiconductor body and a second end opposite the first end; forming a drain region having a first end proximate to a second side of semiconductor body and a second end opposite the first end; and forming an epitaxial oxide plug in at least one of the second end of the source region and the second end of the drain region, wherein the epitaxial oxide plug strains a region of the semiconductor body via the at least one of the source region and the drain region.

Example 20 includes the subject matter of Example 19, wherein the epitaxial oxide plug has a perovskite crystal structure.

Example 21 includes the subject matter of Examples 19 or 20, wherein the epitaxial oxide plug comprises oxygen and at least one of strontium, titanium, lanthanum, aluminum, neodymium, and gadolinium.

Example 22 includes the subject matter of Examples 19-21, wherein the epitaxial oxide plug has a first lattice parameter that is less than 1% different from a second lattice parameter of the adjacent one of the source region and the drain region.

Example 23 includes the subject matter of Examples 19-22, wherein the epitaxial oxide plug comprises a first plurality of crystallographic planes that are coherent with a second plurality of crystallographic planes of the adjacent one of the source region and the drain region.

Example 24 includes the subject matter of Examples 19-23, wherein the epitaxial oxide plug causes from 0.5% to 2% strain of a third lattice parameter in the region of the semiconductor body.

Example 25 includes the subject matter of Example 24, wherein the strain is one of compressive strain or tensile strain.

Example 26 includes the subject matter of Example 24, wherein the third lattice parameter of the region of the semiconductor body is less than 1% different from a fourth lattice parameter of the substrate.

Example 27 includes the subject matter of Example 24, further comprising forming a gate structure over the region of the semiconductor body, thereby defining a channel region of the transistor.

Example 28 is a method for forming an integrated circuit structure, the method comprising: forming a first semiconductor body on a substrate; forming a first set of spacers on opposing sides of the first semiconductor body; forming as a second semiconductor body proximate to the first semiconductor body; forming a second set of spacers on opposing sides of the second semiconductor body; forming one of a source region and a drain region between the first semiconductor body and the second semiconductor body; removing the second semiconductor body from between the second set of spacers; and forming an epitaxial oxide plug between the second set of spacers, wherein the epitaxial oxide plug strains a region of the first semiconductor body via the at least one of the source region and the drain region.

Example 29 includes the subject matter of Example 28, wherein the epitaxial oxide plug has a perovskite crystal structure.

Example 30 includes the subject matter of either of Examples 28 or 29, wherein the epitaxial oxide plug comprises oxygen and at least one of strontium, titanium, lanthanum, aluminum, neodymium, and gadolinium.

Example 31 includes the subject matter of any of Examples 28-30, wherein the epitaxial oxide plug has a first lattice parameter that is less than 1% different from a second lattice parameter of the adjacent one of the source region and the drain region.

Example 32 includes the subject matter of any of Examples 28-31, wherein the epitaxial oxide plug comprises a first plurality of crystallographic planes that are coherent with a second plurality of crystallographic planes of the adjacent one of the source region and the drain region.

Example 33 includes the subject matter of any of Examples 28-32, wherein the epitaxial oxide plug causes from 0.5% to 2% strain of a third lattice parameter in the channel region of the semiconductor body.

Example 34 includes the subject matter of Example 33, wherein the strain is one of compressive strain or tensile strain.

Example 35 includes the subject matter of Example 33, wherein the third lattice parameter of the region of the semiconductor body is less than 1% different from a fourth lattice parameter of the substrate.

Example 36 includes the subject matter of any of Examples 28-35, further comprising forming a gate structure over the region of the semiconductor body, thereby defining a channel region of the transistor.

What is claimed is:

1. An integrated circuit device comprising:
a nanowire comprising a semiconductor material;
a gate structure completely surrounding a channel region of the nanowire;
a source region and a drain region adjacent to, and on opposing sides of, the nanowire, the source and drain regions comprising a semiconductor composition that is distinct from the semiconductor material of the nanowire, wherein one of the source region or the drain region has a portion laterally adjacent to the nanowire; and
a plug comprising oxide material laterally adjacent to the portion of the one of the source region or the drain region laterally adjacent to the nanowire, the plug having a perovskite crystal structure.

2. The integrated circuit device of claim 1, further comprising:
a second nanowire above the nanowire, wherein the gate structure completely surrounds a channel region of the second nanowire.

3. The integrated circuit device of claim 1, wherein the plug comprises oxygen and at least one of strontium, titanium, lanthanum, aluminum, neodymium, and gadolinium.

4. The integrated circuit device of claim 1, wherein the plug has a first lattice parameter that is less than 1% different from a second lattice parameter of the adjacent one of the source region and the drain region.

5. The integrated circuit device of claim 1, wherein the plug comprises a first plurality of crystallographic planes that are coherent with a second plurality of crystallographic planes of the adjacent one of the source region and the drain region.

6. The integrated circuit device of claim 1, wherein the plug causes from 0.5% to 2% of strain of a third lattice parameter in the channel region of the nanowire.

7. The integrated circuit device of claim 6, wherein the third lattice parameter of the channel region of the nanowire is less than 1% different from a fourth lattice parameter of a substrate below the nanowire.

8. The integrated circuit device of claim 6, wherein the nanowire comprises a p-MOS channel material and the strain comprises compressive strain of the third lattice parameter of the p-MOS channel material.

9. The integrated circuit device of claim 8, wherein:
the p-MOS channel material comprises silicon and germanium; and wherein the integrated circuit device further comprises a layer of from 70 atomic % to 75 atomic % silicon and 25 atomic % to 30 atomic % germanium under the nanowire, the source region, and the drain region, wherein the p-MOS channel material comprises more than 50 atomic % germanium.

10. The integrated circuit device of claim 6, wherein the nanowire comprises an n-MOS channel material and the strain comprises tensile strain of the third lattice parameter of the n-MOS channel material.

11. The integrated circuit device of claim 10, wherein:
the n-MOS channel material comprises silicon; and
the integrated circuit device further comprising a layer of from 70 atomic % to 75 atomic % silicon and 25 atomic % to 30 atomic % germanium under the nanowire, the source region, and the drain region, wherein the n-MOS channel material comprises less than 25 atomic % germanium.

12. The integrated circuit device of claim 1, further comprising a first spacer in contact with the adjacent one of the source region and the drain region and a second spacer, wherein the plug is between the first spacer and the second spacer.

13. The integrated circuit device of claim 1, wherein the nanowire comprises indium and phosphorous, and wherein the source region and the drain region comprise indium, gallium, and arsenic.

14. The integrated circuit device of claim 1, further comprising a substrate under the nanowire, the substrate comprising a fourth lattice parameter, and wherein the channel region of the nanowire comprises a third lattice parameter that is less than 1% different from the fourth lattice parameter.

15. The integrated circuit device of claim 1, further comprising a substrate under the nanowire and a buffer layer between the substrate and the nanowire, the buffer layer and the nanowire having lattice parameters more than 1% different from one another.

16. A computing device, comprising:
a board; and
a component coupled to the board, the component including an integrated circuit structure, the integrated circuit structure comprising:
a nanowire comprising a semiconductor material;
a gate structure completely surrounding a channel region of the nanowire;
a source region and a drain region adjacent to, and on opposing sides of, the nanowire, the source and drain regions comprising a semiconductor composition that is distinct from the semiconductor material of the nanowire, wherein one of the source region or the drain region has a portion laterally adjacent to the nanowire; and
a plug comprising oxide material laterally adjacent to the portion of the one of the source region or the drain region laterally adjacent to the nanowire, the plug having a perovskite crystal structure.

17. The computing device of claim 16, further comprising:
a memory coupled to the board.

18. The computing device of claim 16, further comprising:
a communication chip coupled to the board.

19. The computing device of claim 16, wherein the component is a packaged integrated circuit die.

20. The computing device of claim 16, wherein the component is selected from the group consisting of a processor, a communications chip, and a digital signal processor.

* * * * *